(12) United States Patent
Yoo et al.

(10) Patent No.: US 11,796,719 B2
(45) Date of Patent: Oct. 24, 2023

(54) PROTECTION FILM FOR FOLDABLE DISPLAY AND FOLDABLE DISPLAY DEVICE COMPRISING SAME

(71) Applicant: LG CHEM, LTD., Seoul (KR)

(72) Inventors: Han Sol Yoo, Daejeon (KR); Hyun Cheol Kim, Daejeon (KR); Hyon Gyu Park, Daejeon (KR); Hee Song, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 17/272,163

(22) PCT Filed: Oct. 8, 2019

(86) PCT No.: PCT/KR2019/013194
§ 371 (c)(1),
(2) Date: Feb. 26, 2021

(87) PCT Pub. No.: WO2020/076053
PCT Pub. Date: Apr. 16, 2020

(65) Prior Publication Data
US 2021/0349242 A1   Nov. 11, 2021

(30) Foreign Application Priority Data

Oct. 11, 2018  (KR) .................. 10-2018-0120972

(51) Int. Cl.
*G02B 1/14* (2015.01)
*B32B 7/12* (2006.01)
(Continued)

(52) U.S. Cl.
CPC .................. *G02B 1/14* (2015.01); *B32B 7/12* (2013.01); *B32B 27/08* (2013.01); *B32B 27/28* (2013.01);
(Continued)

(58) Field of Classification Search
CPC .. G02B 1/14; B32B 27/28; B32B 7/12; B32B 27/08; B32B 2255/10; B32B 2307/51;
(Continued)

(56) References Cited

U.S. PATENT DOCUMENTS 9,777,203 B2   10/2017   Newsham et al.
9,859,526 B2   1/2018   Lee et al.
(Continued)

FOREIGN PATENT DOCUMENTS

CN    106409150 A    2/2017
EP    3109742 A1    12/2016
(Continued)

OTHER PUBLICATIONS

International Search Report and Written Opinion issued for International Application No. PCT/KR2019/013194 dated Jan. 17, 2020, 9 pages.
(Continued)

*Primary Examiner* — John D Freeman
(74) *Attorney, Agent, or Firm* — ROTHWELL, FIGG, ERNST & MANBECK, P.C.

(57) ABSTRACT

Provided are a protective film for a foldable display and a foldable display device comprising the same.

10 Claims, 2 Drawing Sheets

(51) Int. Cl.
  *B32B 27/08* (2006.01)
  *B32B 27/28* (2006.01)
(52) U.S. Cl.
  CPC ....... *B32B 2255/10* (2013.01); *B32B 2307/42* (2013.01); *B32B 2307/51* (2013.01); *B32B 2457/206* (2013.01)
(58) Field of Classification Search
  CPC .......... B32B 2307/42; B32B 2457/206; B32B 27/281; B32B 27/40; B32B 2307/732; B32B 2457/20; B32B 7/06; C09J 7/29; C09J 2203/318; C09J 2301/122; H10K 50/844
  See application file for complete search history.

(56) References Cited

U.S. PATENT DOCUMENTS

| | | | |
|---|---|---|---|
| 9,911,793 | B2 | 5/2018 | Lee et al. |
| 10,033,015 | B1 * | 7/2018 | Brotzman ............. B32B 27/325 |
| 10,399,310 | B2 | 9/2019 | Nodono et al. |
| 2003/0178124 | A1 | 9/2003 | Mikami et al. |
| 2016/0046103 | A1 | 2/2016 | Hong et al. |
| 2016/0155967 | A1 * | 6/2016 | Lee .................... H01L 51/0097 257/88 |
| 2017/0002237 | A1 * | 1/2017 | Cho ............................ C09J 7/10 |
| 2017/0028677 | A1 | 2/2017 | Lee et al. |
| 2017/0036242 | A1 | 2/2017 | Lee et al. |
| 2017/0349786 | A1 | 12/2017 | Kim et al. |
| 2017/0374737 | A1 | 12/2017 | Jeong et al. |
| 2018/0001347 | A1 * | 1/2018 | Cho .................. G02F 1/133308 |
| 2019/0211234 | A1 | 7/2019 | Yamasaki et al. |
| 2019/0219740 | A1 | 7/2019 | Horio et al. |
| 2019/0252637 | A1 * | 8/2019 | Wu .................... H01L 51/5253 |
| 2020/0339769 | A1 | 10/2020 | Lee et al. |

FOREIGN PATENT DOCUMENTS

| | | |
|---|---|---|
| EP | 3480010 A1 | 5/2019 |
| JP | 2006-299283 A | 11/2006 |
| JP | 2016-108555 A | 6/2016 |
| JP | 2016-114760 A | 6/2016 |
| JP | 2017-16655 A | 1/2017 |
| JP | 2017-33031 A | 2/2017 |
| JP | 2017-36439 A | 2/2017 |
| JP | 2017-121744 A | 7/2017 |
| JP | 2018-502192 A | 1/2018 |
| JP | 2018-27996 A | 2/2018 |
| JP | 6376271 B2 | 8/2018 |
| KR | 10-0838461 B1 | 6/2008 |
| KR | 10-2014-0122385 A | 10/2014 |
| KR | 10-2016-0099158 A | 8/2016 |
| KR | 10-2017-0036190 A | 4/2017 |
| KR | 10-2017-0116513 A | 10/2017 |
| KR | 10-2018-0016388 A | 2/2018 |
| KR | 10-2018-0068840 A | 6/2018 |
| KR | 10-2018-0096448 A | 8/2018 |
| KR | 10-2018-0099210 A | 9/2018 |
| WO | 2015-151203 A1 | 10/2015 |
| WO | 2017-014287 A1 | 1/2017 |
| WO | WO-2018159285 A1 * | 9/2018 ............. B32B 27/30 |

OTHER PUBLICATIONS

Office Action issued in the corresponding Japanese Patent Application No. 2021-504772 dated Mar. 29, 2022 with English translation, 8 pages.

Opposition of Japanese Patent Office in Appl'n No. 2021-504772, dated Jun. 20, 2023, 32 pages.

* cited by examiner

【FIG. 1】
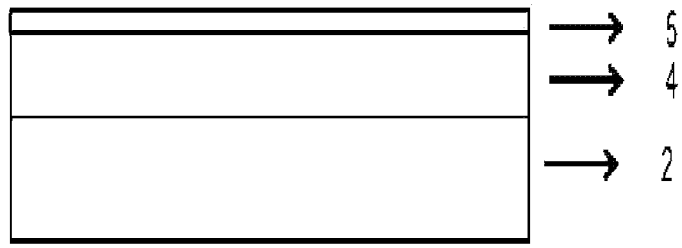
【FIG. 2】
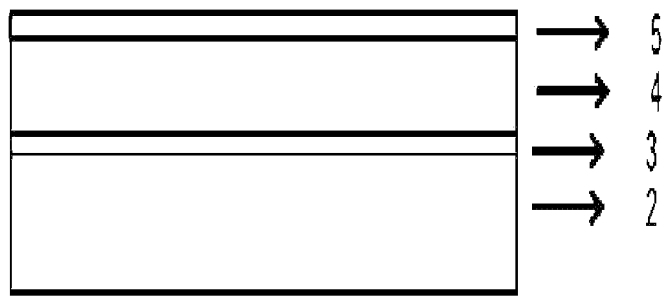
【FIG. 3】
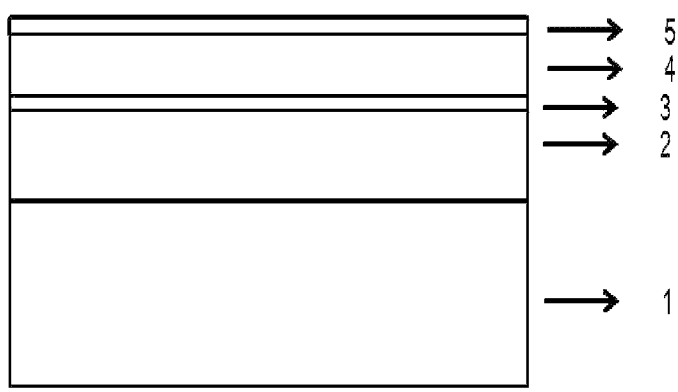

[FIG. 4]
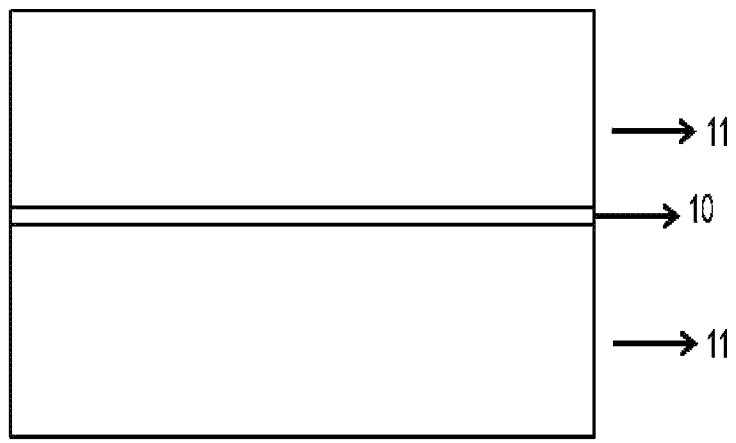
[FIG. 5]
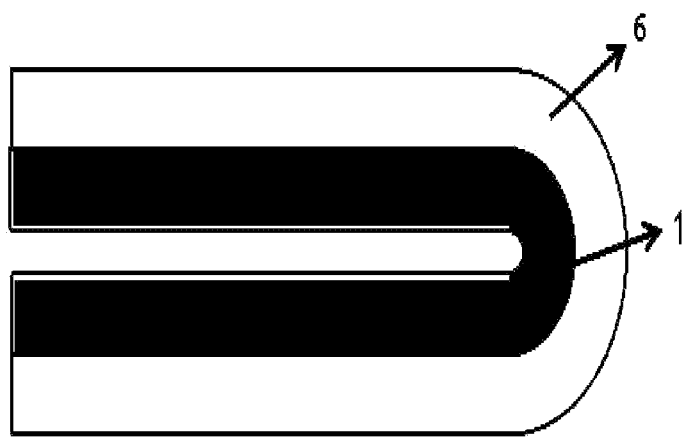

PROTECTION FILM FOR FOLDABLE DISPLAY AND FOLDABLE DISPLAY DEVICE COMPRISING SAME

TECHNICAL FIELD

This application is a 35 U.S.C. 371 National Phase Entry Application from PCT/KR2019/013194 filed on Oct. 8, 2019 and designating the United States and claims priority to and the benefits of Korean Patent Application No. 10-2018-0120972, filed with the Korean Intellectual Property Office on Oct. 11, 2018, the entire contents of which are incorporated herein by reference.

The present application relates to a protective film for a foldable display and a foldable display device comprising the same.

BACKGROUND OF THE INVENTION

Recently, portable terminals such as wireless terminals, personal digital assistants (PDAs), portable multimedia players (PMPs) and electronic organizers have become smaller in size for portability.

However, users want to receive information from various contents such as text information, videos and games through the screens of portable terminals and thus need to enlarge or widen display screens in size. However, the reduction in the size of portable terminals leads to a reduction in the size of display screens, so there is a limitation in satisfying both requirements.

Conventional display devices use unbreakable displays not allowing for deformation, but curved displays, bended displays, foldable displays, rollable displays and the like have been developed in order to overcome this limitation.

Currently, only the mobile field in the form of a bended display is in the commercialization stage and the mobile field using foldable displays is expected to appear in earnest. In addition, the electric field using pOLED is also remarkably being developed.

When using conventional tablet PCs or smartphones, the user attaches a protective substrate to the outermost layer of the display product and/or the back surface of the display product in order to prevent scratches of the product display. Protective substrates such as PET protective films, tempered glass and urethane films are generally applied to conventional tablet PCs or smartphones, which are flat panel displays.

However, when PET protective films or tempered glass protective films are applied to foldable displays, problems occur in which a folding mark is formed on a folding surface, or in which the protective film is lifted from the folding surface when the folding and unfolding operations are repeated multiple times.

Accordingly, there is a need for the development of a protective substrate, which is used as a protective substrate for a foldable display and is not lifted from the display surface even after repeated folding and unfolding multiple times, and an adhesive for attaching the protective substrate to a foldable display.

BRIEF SUMMARY OF THE INVENTION

The present application is directed to providing a protective film for a foldable display and a foldable display device comprising the same.

One embodiment of the present application provides a protective film for a foldable display comprising: an adhesive layer; a protective substrate provided on one surface of the adhesive layer; and a first hard coating layer provided on an opposite surface to the surface of the protective substrate in contact with the adhesive layer, wherein the protective substrate has a thickness of 10 µm or more and 150 µm or less, and the adhesive force measured at 23° C. and 50 RH % after bonding a PI substrate to the opposite surface to the surface of the adhesive layer in contact with the protective substrate is 10 gf/inch or more.

Another embodiment of the present application provides a foldable display device comprising: a foldable display; and the protective film for a foldable display according to one embodiment of the present application, provided on one surface of the foldable display, wherein the adhesive layer of the protective film for a foldable display is in contact with one surface of the foldable display.

The protective film for a foldable display according to one embodiment of the present application maintains the adhesive force between the adhesive layer and the PI substrate within a certain range, thus avoiding a subsequent lifting phenomenon between the protective substrate and the cover window of the foldable display, even if the foldable display device is repeatedly folded and unfolded multiple times.

In addition, the protective film for a foldable display according to another embodiment of the present application maintains the thickness of the protective substrate within a specific range, thus efficiently preventing scratches of the foldable display device from external impact and providing excellent durability of the protective substrate.

BRIEF DESCRIPTION OF DRAWINGS

FIG. 1 is a sectional view showing a laminated structure of a protective film for a foldable display according to one embodiment of the present application.

FIG. 2 is a sectional view showing a laminated structure of a protective film for a foldable display according to another embodiment of the present application.

FIG. 3 is a sectional view showing a laminated structure of a device for a foldable display according to one embodiment of the present application.

FIG. 4 is a sectional view showing one surface of a foldable display included in the device for the foldable display according to one embodiment of the present application.

FIG. 5 is a sectional view showing a foldable display device according to one embodiment of the present application.

REFERENCE NUMERAL

1: Foldable display
2: Adhesive layer
3: Second hard coating layer
4: Protective substrate
5: First hard coating layer
6: Protective film for foldable display
10: First region
11: Second region

DETAILED DESCRIPTION OF THE INVENTION

Hereinafter, the present specification will be described in more detail.

In the present specification, it will be understood that, when a portion is referred to as "including" one element, the portion may further comprise another element and does not preclude the presence thereof, unless clearly indicates otherwise.

Hereinafter, specific embodiments of the present disclosure will be described in more detail with reference to the attached drawings such that those skilled in the art to which the present disclosure pertains can easily implement the embodiments. However, the present disclosure can be implemented into various forms and is not limited to the embodiments described herein.

One embodiment of the present application provides a protective film for a foldable display comprising: an adhesive layer; a protective substrate provided on one surface of the adhesive layer; and a first hard coating layer provided on an opposite surface to the surface of the protective substrate in contact with the adhesive layer, wherein the protective substrate has a thickness of 10 μm or more and 150 μm or less, and the adhesive force measured at 23° C. and 50 RH % after bonding a PI substrate to the opposite surface to the surface of the adhesive layer in contact with the protective substrate is 10 gf/inch or more.

The protective film for a foldable display according to one embodiment of the present application maintains the adhesive force between the adhesive layer and the PI substrate within a certain range, thus avoiding a subsequent lifting phenomenon between the protective substrate and the cover window of the foldable display, even if the foldable display device is repeatedly folded and unfolded multiple times. In addition, the protective film for a foldable display maintains the thickness of the protective substrate within a specific range, thus efficiently preventing scratches from external impact of the foldable display device and providing excellent durability of the protective substrate.

Unlike protective films for general hard-type displays, the protective film for foldable display according to the present application satisfies the structure/thickness/adhesion ranges. Thus, in the case where the protective film for a foldable display is used for foldable displays, when the foldable display is folded at a curvature of 4R (the interval between the protective films is 8 mm) such that the outer surface is a protective substrate, is left for 1 day and is then unfolded, the adhesive force between the adhesive layer and the protective substrate is 10 gf/inch or more, thereby avoiding the detachment of the adhesive layer from the protective substrate.

FIG. 1 shows a laminated structure of a protective film for a foldable display according to one embodiment of the present application and more specifically, a laminated structure in which an adhesive layer 2, a protective substrate 4 and a first hard coating layer 5 are stacked in this order.

One embodiment of the present application provides a protective film for a foldable display wherein the adhesive force measured at 23° C. and 50 RH % after bonding a PI substrate to the opposite surface to the surface of the adhesive layer in contact with the protective substrate is 10 gf/inch or more.

The adhesive force was measured using a texture analyzer (Stable Micro Systems, Inc.) at an angle of 180° and a peeling rate of 300 mm/min and is a value measured by reciprocating the PI substrate once with a 2 kg rubber roller on the adhesive layer of the present disclosure to attach the PI substrate to the adhesive layer and then peeling the PI substrate at an angle of 180° and a peeling rate of 300 mm/min at 23° C. and 50 RH %.

In another embodiment of the present application, the adhesive force measured at 23° C. and 50 RH % after bonding a PI substrate to the opposite surface to the surface of the adhesive layer in contact with the protective substrate is 10 gf/inch or more, preferably 15 gf/inch or more, more preferably 25 gf/inch or more.

In another embodiment of the present application, the adhesive force measured at 23° C. and 50 RH % after bonding a PI substrate to the opposite surface to the surface of the adhesive layer in contact with the protective substrate is 500 gf/inch or less, preferably 400 gf/inch or less, more preferably 300 gf/inch or less.

The protective film for a foldable display according to the present application maintains the adhesive force after bonding the PI substrate to the opposite surface to the surface of the adhesive layer in contact with the protective substrate within a certain range, thereby maintaining the adhesive force with the protective substrate and thus avoiding a lifting phenomenon, even if the foldable display device is repeatedly folded and unfolded multiple times. In addition, the predetermined adhesive force range enables free folding and unfolding operations of foldable display devices without any limitation.

When the adhesive force measured after bonding the PI substrate to the opposite surface to the surface of the adhesive layer in contact with the protective substrate exceeds the predetermined range, the adhesive agent may be transferred later to the cover window of the foldable display and cause contamination due to the excessive strong adhesive force. When the adhesive force is less than the predetermined range, the adhesive force between the adhesive layer and the protective substrate cannot be maintained when the foldable display is folded, causing a lifting phenomenon.

The adhesive force may be designed by adjusting the thickness of the adhesive layer and the composition of the adhesive layer and the adhesive force may be satisfied by controlling the content of the tackifier included in the adhesive layer and the content range of the curing agent. Specifically, the cohesion force of the adhesive layer, the surface properties with the PI substrate, the wettability and the like should be considered. In general, the adhesive force tends to increase as the thickness increases and the tackifier increases. The adhesive force with PI may be adjusted within the predetermined range in consideration of these factors.

In one embodiment of the present application, the protective substrate may have a thickness of 10 μm or more and 150 μm or less.

In another embodiment, the protective substrate may have a thickness of 10 μm or more and 150 μm or less, preferably 20 μm or more and 140 μm or less, more preferably 25 μm or more and 130 μm or less.

Since the thickness of the protective substrate satisfies the predetermined range, the foldable display device is freely folded and unfolded without any limitation and the cover window of the foldable display can be protected from external scratches. Also, a protective film for a foldable display having excellent durability can be provided since the protective substrate is not lifted even upon repeated folding and unfolding operations.

One embodiment of the present application provides a protective film for a foldable display wherein the adhesive layer has a thickness of 5 μm or more and 50 μm or less.

In another embodiment, the adhesive layer may have a thickness of 5 μm or more and 50 μm or less, preferably 10 μm, or more and 40 μm or less, more preferably 15 μm or more and 30 μm or less.

By adjusting the thickness of the adhesive layer within the predetermined range, the adhesive force of the adhesive layer can be controlled within the range according to the present application.

One embodiment of the present application provides a protective film for a foldable display further comprising a second hard coating layer between the adhesive layer and the protective substrate.

FIG. 2 shows a laminated structure of a protective film for a foldable display according to one embodiment of the present application, and specifically, a laminated structure in which an adhesive layer 2, a second hard coating layer 3, a protective substrate 4 and a first hard coating layer 5 are staked in this order.

One embodiment of the present application provides a protective film for a foldable display wherein the first hard coating layer and the second hard coating layer each have a thickness of 1 µm or more and 10 µm or less.

One embodiment of the present application provides a protective film for a foldable display wherein the first hard coating layer has a thickness of 1 µm or more and 10 µm or less.

One embodiment of the present application provides a protective film for a foldable display wherein the second hard coating layer has a thickness of 1 µm or more and 10 µm or less.

One embodiment of the present application provides a protective film for a foldable display wherein the first hard coating layer and the second hard coating layer each have a thickness of 1 µm or more and 10 µm or less, preferably 2 µm or more and 8 µm or less, more preferably 3 µm or more and 6 µm or less.

Since the first hard coating layer and the second hard coating layer have the predetermined thickness ranges, curling caused by different physical properties between the protective substrate and the first and second hard coating layers can be minimized, and the scratch resistance and hardness of the protective substrate can be secured.

One embodiment of the present application provides a protective film for a foldable display wherein the protective substrate is selected from the group consisting of TPU, glass, polyethylene terephthalate (PET), polyester, polycarbonate (PC), polyimide (PI), polyethylene naphthalate (PEN), polyether ether ketone (PEEK), polyarylate (PAR), polycyclic olefin (PCO), polynorbornene, polyethersulphone (PES) and a cycloolefin polymer (COP).

The protective substrate according to the present application is attached to one side of the adhesive layer and the protective substrate may be specifically a PET film, a TPU film or glass.

One embodiment of the present application provides a protective film for a foldable display wherein the adhesive layer comprises at least one adhesive selected from the group consisting of acrylic adhesives, silicone adhesives, urethane adhesives and rubber adhesives.

In one embodiment of the present application, the adhesive layer may comprise a silicone adhesive.

In one embodiment of the present application, the adhesive layer may comprise a polymer comprising at least one selected from the group consisting of a (meth)acrylate resin and polysiloxane.

The polymer refers to a substance obtained by polymerizing two or more types of different monomers (units), and may have a structure in which two or more types of monomers are arranged irregularly or regularly.

The polymer may be a random polymer in which monomers are mixed with one another randomly, a block copolymer in which blocks aligned in each predetermined section are repeated, or an alternating polymer in which monomers are alternately repeated and polymerized, and the polymer comprising at least one selected from the group consisting of a (meth)acrylate resin and polysiloxane may be a random polymer, block polymer or alternating polymer.

In one embodiment of the present application, the acrylate resin may comprise a (meth)acrylate resin having a weight average molecular weight of 100,000 g/mol to 5,000,000 g/mol.

The weight average molecular weight refers to an average molecular weight, the molecular weight of which is not uniform and that uses the molecular weight of a certain polymeric material as a reference, and is a value obtained by averaging the molecular weight of component molecular species of a polymeric compound having a molecular weight distribution as a weight fraction.

The weight average molecular weight can be measured through gel permeation chromatography (GPC) analysis.

In the present specification, (meth)acrylate is intended to comprise both acrylate and methacrylate. The (meth)acrylate resin may be, for example, a copolymer of a (meth)acrylic acid ester monomer and a crosslinkable functional-group-containing monomer.

The (meth)acrylic acid ester monomer is not specifically limited, but is, for example, alkyl (meth)acrylate, and more specifically, may comprise, as a monomer having a C1-C12 alkyl group, at least one of pentyl (meth)acrylate, n-butyl (meth)acrylate, ethyl (meth)acrylate, methyl (meth)acrylate, hexyl (meth)acrylate, n-octyl (meth)acrylate, isooctyl (meth)acrylate, 2-ethyl hexyl (meth)acrylate, dodecyl (meth)acrylate and decyl (meth)acrylate.

The crosslinkable functional-group-containing monomer is not particularly limited, but may, for example, comprise at least one of a hydroxyl-group-containing monomer, a carboxyl-group-containing monomer and a nitrogen-containing monomer.

Examples of the hydroxyl-group-containing compound comprise 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 2-hydroxyethylene glycol (meth)acrylate, 2-hydroxypropylene glycol (meth)acrylate and the like.

Examples of the carboxyl-group-containing compound comprise (meth)acrylic acid, 2-(meth)acryloyloxyacetic acid, 3-(meth) acryloyloxypropanoic acid, 4-(meth)acryloyloxybutyric acid, acrylic acid dimers, itaconic acid, maleic acid, maleic anhydride and the like.

Examples of the nitrogen-containing monomer comprise (meth)acrylonitrile, N-vinyl pyrrolidone, N-vinyl caprolactam, and the like.

At least one of vinyl acetate, styrene and acrylonitrile may be further copolymerized with the (meth)acrylate resin in view of other functionalities such as compatibility.

In one embodiment of the present application, the acrylate resin may be selected from the group consisting of alkyl (meth)acrylate, hydroxyalkyl acrylate and a nitrogen-containing monomer.

The alkyl acrylate and alkyl methacrylate may comprise, as a monomer having a C1-C12 alkyl group, at least one of pentyl (meth)acrylate, n-butyl (meth)acrylate, ethyl (meth)acrylate, methyl (meth)acrylate, hexyl (meth)acrylate, n-octyl (meth)acrylate, isooctyl (meth)acrylate, 2-ethylhexyl (meth)acrylate, dodecyl (meth)acrylate and decyl (meth)acrylate.

Examples of the hydroxyalkyl acrylate comprise 2-hydroxyethyl acrylate, 2-hydroxypropyl acrylate, 4-hydroxybutyl acrylate, 6-hydroxyhexyl acrylate, 8-hydroxyoctyl acrylate, 2-hydrmyethylene glycol acrylate, 2-hydroxypropylene glycol acrylate and the like.

Examples of the nitrogen-containing monomer comprise N-vinyl pyrrolidone (VP) and the like.

In one embodiment of the present application, the polysiloxane has a chain of a siloxane bond (—Si—O bond) and may comprise polyorganosiloxane.

In one embodiment of the present application, the polysiloxane may be polydimethyl siloxane (PDMS).

One embodiment of the present application provides a protective film for a foldable display, wherein the adhesive layer further comprises at least one selected from the group consisting of a crosslinkable compound, a dispersant, a silane coupling agent, a photocuring agent, a thermosetting agent, a metal salt and a tackifier.

According to one embodiment of the present specification, the crosslinkable compound may comprise at least one selected from the group consisting of: compounds obtained by esterifying polyhydric alcohols such as hexanediol di(meth)acrylate, ethylene glycol di(meth)acrylate, polyethylene glycol di(meth)acrylate having 2 to 14 ethylene groups, trimethylolpropane di(meth)acrylate, trimethylolpropane tri(meth)acrylate, pentaerythritol tri(meth)acrylate, pentaerythritol tetra(meth)acrylate, 2-trisacryloyloxymethylethylphthalic acid, propylene glycol di(meth)acrylate having 2 to 14 propylene groups, dipentaerythritol penta(meth)acrylate, dipentaerythritol hexa(meth)acrylate, or a mixture of an acid-modified product of dipentaerythritol penta(meth)acrylate and dipentaerythritol hexa(meth)acrylate (commercially available from Toagosei Co., Ltd., Japan, under the trade names of TO-2348 and TO-2349) with α, β-unsaturated carboxylic acid; compounds obtained by adding (meth)acrylic acid to glycidyl-group-containing compounds such as trimethylolpropane triglycidyletheracrylic acid adducts and bisphenol A diglycidyletheracrylic acid adducts; ester compounds of compounds having hydroxyl groups or ethylenically unsaturated bonds, such as diester phthalate of β-hydroxyethyl (meth)acrylate and toluene diisocyanate adducts of β-hydroxyethyl (meth)acrylate, with polycarboxylic acid, or their adducts with polyisocyanate; (meth)acrylate alkyl ester such as methyl(meth)acrylate, ethyl(meth)acrylate, butyl(meth)acrylate, and 2-ethylhexyl(meth)acrylate; and 9,9'-bis[4-(2-acryloyloxyethoxy) phenyl]fluorene, but is not limited thereto. General compounds known in the technical field to which the present disclosure pertains may be used.

In an embodiment of the present specification, the photocuring agent may be substituted with one or more substituents selected from the group consisting of a triazine-based compound, a biimidazole-based compound, an acetophenone-based compound, an O-acyloxime-based compound, a thioxanthone-based compounds, a phosphine oxide-based compound, a coumarin-based compound and a benzophenone-based compound.

Specifically, in an embodiment of the present specification, the photocuring agent may comprise one, or a mixture of two or more selected from a triazine-based compound such as 2,4-trichloromethyl-(4'-methoxyphenyl)-6-triazine, 2,4-trichloromethyl-(4'-methoxystyryl)-6-triazine, 2,4-trichloromethyl-(fipronil)-6-triazine, 2,4-trichloromethyl-(3',4'-dimethoxyphenyl)-6-triazine, 3-{4-[2,4-bis(trichloromethyl)-s-triazin-6-yl]phenylthio} propanoic acid, 2,4-trichloromethyl-(4'-ethylbiphenyl)-6-triazine or 2,4-trichloromethyl-(4'-methylbiphenyl)-6-triazine; a biimidazole-based compound such as 2,2'-bis(2-chlorophenyl)-4,4',5,5'-tetraphenylbiimidazole or 2,2'-bis(2,3-dichlorophenyl)-4,4',5,5'-tetraphenylbiimidazole; an acetophenone-based compound such as 2-hydroxy-2-methyl-1-phenylpropan-1-one, 1-(4-isopropylphenyl)-2-hydroxy-2-methylpropan-1-one, 4-(2-hydroxyethoxy)-phenyl(2-hydroxy)propyl ketone, 1-hydroxycyclohexyl phenyl ketone, 2,2-dimethoxy-2-phenyl acetophenone, 2-methyl-(4-methylthiophenyl)-2-morpholino-1-propan-1-one (Irgacure-907) or 2-benzyl-2-dimethylamino-1-(4-morpholinophenyl)-butan-1-one (Irgacure-369); an O-acyloxime-based compound such as Irgacure OXE 01 or Irgacure OXE 02 produced by Ciba Geigy Co., Ltd.; a benzophenone-based compound such as 4,4'-bis(dimethylamino)benzophenone or 4,4'-bis(diethylamino)benzophenone; a thioxantone-based compound such as 2,4-diethyl thioxantone, 2-chlorothioxantone, isopropyl thioxantone or diisopropyl thioxantone; a phosphine oxide-based compound such as 2,4,6-trimethylbenzoyl diphenyl phosphine oxide, bis(2,6-dimethoxybenzoyl)-2,4,4-trimethylpentyl phosphine oxide or bis(2,6-dichlorobenzoyl) propyl phosphine oxide; and a coumarin-based compound such as 3,3'-carbonylvinyl-7-(diethylamino)coumarin, 3-(2-benzothiazolyl)-7-(diethylamino)coumarin, 3-benzoyl-7-(diethylamino) coumarin, 3-benzoyl-7-methoxy-coumarin or 10,10'-carbonylbis[1,1,7,7-tetramethyl-2,3,6,7-tetrahydro-1H,5H,11H—Cl]-benzopyrano[6,7,8-ij]-quinolizin-11-one, but is not limited thereto.

Also, the photocuring agent may be selected from those well-known in the art.

According to one embodiment of the present application, the metal salt may be an Li-containing inorganic salt, and the Li-containing inorganic salt may be LiTFSI (bi(trifluoromethane) sulfonimide lithium salt).

One embodiment of the present application provides a protective film for a foldable display further comprising a release film on the opposite surface to the surface of the adhesive layer in contact with the protective substrate, or an opposite surface to the surface of the first hard coating layer in contact with the protective substrate.

One embodiment of the present application provides a protective film for a foldable display further comprising a release film on the opposite surface to the surface of the adhesive layer in contact with the protective substrate, and on an opposite surface to the surface of the first hard coating layer in contact with the protective substrate.

The release film may be a layer for protecting an adhesive layer, which has a very thin thickness, may be a transparent layer attached to one surface of the adhesive layer, and may be a film having excellent mechanical strength, thermal stability, moisture-blocking property and isotropy. For example, the release film may be a film of acetate (such as triacetyl cellulose, TAC), polyester, polyether sulfone, polycarbonate, polyamide, polyimide, polyolefin, cycloolefin, polyurethane or acrylic resin film or the like. Any commercially available fluorine-treated release film or silicon-treated release film may be used without limitation.

The release film may be removed when the protective film for a foldable display is adhered to a foldable display device.

Another embodiment of the present application provides a foldable display device comprising: a foldable display; and the protective film for a foldable display according to one embodiment of the present application, provided on one surface of the foldable display, wherein the adhesive layer of the protective film for a foldable display is in contact with one surface of the foldable display.

FIG. 3 is a sectional view showing a laminated structure of a foldable display device according to one embodiment of the present application. More specifically, the foldable display device has a structure in which a foldable display 1, an adhesive layer 2, a second hard coating layer 3, a protective substrate 4, and a first hard coating layer 5 are stacked in this order, and one surface of the foldable display comes in contact with the adhesive layer of the protective film for a foldable display.

In FIG. 3, the second hard coating layer 3 may be omitted.

In one embodiment of the present application, the foldable display has a structure in which a flexible substrate, an organic light-emitting layer, a polarizer and a cover window are stacked in this order, wherein the adhesive layer of the protective film for the foldable display is provided on an opposite surface to the surface of the cover window in contact with the polarizer.

The protective film for a foldable display according to the present application prevents scratching of the cover window of the foldable display, and the protective substrate may be attached to one surface of the cover window through the adhesive layer.

That is, the protective film for a foldable display according to one embodiment of the present application may be used to protect the cover window of the foldable display device.

One embodiment of the present application provides a protective film for a foldable display wherein the flexible substrate is selected from the group consisting of TPU, glass, polyethylene terephthalate (PET), polyester, polycarbonate (PC), polyimide (PI), polyethylene naphthalate (PEN), polyether ether ketone (PEEK), polyarylate (PAR), polycyclic olefin (PCO), polynorbornene, polyethersulphone (PES) and a cycloolefin polymer (COP).

In another exemplary embodiment, the flexible substrate may be polyimide (PI).

The polyimide (PI) may be a transparent polyimide (PI).

One embodiment of the present application provides a foldable display device wherein an opposite surface to a surface of the foldable display in contact with the adhesive layer comprises a first region having a folding portion and a second region having a non-folding portion, wherein the first region is disposed in a longitudinal direction of the foldable display.

"Longitudinal direction" refers to any direction perpendicular to a stacking thickness direction of the constituent layers of the foldable display device. Specifically, the longitudinal direction refers to any direction included in one surface of the foldable display of the foldable display device.

FIG. 4 is a sectional view showing one surface of the foldable display included in the foldable display device according to one embodiment of the present application. Specifically, as shown in FIG. 3, the first region 10 having a folding portion is disposed in the longitudinal direction of one surface of the foldable display and the second region 11 having a non-folding portion is disposed, based on the first region 10.

In the foldable display according to the present application, the second region having a non-folding portion on one surface of the foldable display may be divided, based on the first region having a folding portion.

That is, as shown in FIG. 4, one side of the foldable display has a first region 10 having a folded portion, and second regions 11 having a non-folding portion which are disposed on both sides of the first region 10, based on the first region 10.

In one embodiment of the present application, when the foldable display is folded based on the first region, the edges of the second regions contact each other.

Contact of the edges of the second regions may mean that the edges contact each other, or that the edges are located close to each other without contacting each other. That is, in the foldable display, the edges of the second regions may contact each other, or if not, may be disposed adjacent to each other.

In the foldable display according to the present application, when the foldable display is folded based on the first region, the edges of the second regions are in contact with each other. Specifically, when the foldable display is folded, the flexible substrate of the foldable display is disposed on the folded inner surface of the foldable display and the protective film for the foldable display comprising the cover window according to the present application may be disposed on the outer surface thereof.

FIG. 5 is a sectional view showing a foldable display device according to one embodiment of the present application, and specifically, shows the folded state of the foldable display device according to the present specification. It can be seen that the protective film 6 for the foldable display according to the application is disposed in an outer area, when the foldable display is folded according to the folding portion.

In the protective film for a foldable display according to one embodiment of the present application, the protective substrate has a thickness of 10 μm or more and 150 μm or less, and the adhesive force between the PI substrate and the opposite side to the surface of the adhesive layer in contact with the protective substrate is 10 gf/inch or more at 23° C. and 50 RH %. Particularly, when the foldable display is folded based on the first region, the edges of the second regions may contact each other.

Hereinafter, specific examples of the present disclosure will be described in more detail such that those skilled in the art to which the present disclosure pertains can easily implement the examples. However, the present disclosure can be implemented into various forms and is not limited to the examples described herein.

PREPARATION EXAMPLE 1

Example 1

CAT-PL-50T as a catalyst was mixed with KR3700, an adhesive agent of Shin-Etsu Co., Ltd., in an amount of 0.5 parts with respect to KR3700 and was diluted with toluene to obtain a 25% solid. In addition, CAT-PL-50T as a catalyst was mixed with KR3704, an adhesive agent of Shin-Etsu Co., Ltd., in an amount of 0.5 parts with respect to KR3700, and was diluted with toluene to obtain a 25% solid. Then, KR3700 and KR3704 were stirred at a mixing ratio of 20:80 and the resulting product was coated on a fluorine release film to a final thickness of 25 μm. In addition, a fluorine release film was laminated on the adhesive layer.

Then, after one surface of a protective substrate shown in Table 1 was corona-treated, one fluorine release film of the adhesive layer was removed and lamination was performed on the corona-treated surface.

TABLE 1

| | Thickness of protective substrate (μm) | Type of protective substrate | Adhesive - cover window (PI) adhesive force (gf/in) | 4R folding evaluation (1 day) |
|---|---|---|---|---|
| Comp. Ex. 1 | 38 | PET | <1 | detachment of protective substrate |
| Ex. 1 | 38 | PET | 12 | maintained |
| Ex. 2 | 38 | PET | 190 | maintained |
| Comp. Ex. 2 | 50 | PET | 8 | detachment of protective substrate |
| Ex. 3 | 50 | PET | 12 | maintained |
| Ex. 4 | 50 | Transparent PI | 12 | maintained |
| Ex. 5 | 50 | PET | 190 | maintained |
| Comp. Ex. 3 | 75 | PET | 8 | detachment of protective substrate |
| Ex. 6 | 75 | TPU | 12 | maintained |
| Ex. 7 | 75 | PET | 190 | maintained |
| Ex. 8 | 75 | TPU | 190 | maintained |
| Comp. Ex. 4 | 125 | PET | 8 | detachment of protective substrate |
| Ex. 9 | 125 | PET | 190 | maintained |
| Comp. Ex. 5 | 188 | PET | 8 | damage of protective substrate |
| Comp. Ex. 6 | 188 | PET | 12 | damage of protective substrate |
| Comp. Ex. 7 | 188 | PET | 190 | damage of protective substrate |
| Comp. Ex. 8 | 200 | Glass | 8 | damage of protective substrate |
| Comp. Ex. 9 | 200 | Glass | 12 | damage of protective substrate |
| Comp. Ex. 10 | 200 | Glass | 190 | damage of protective substrate |
| Comp. Ex. 11 | 38 | PET | <1 | detachment of protective substrate |

1 pt of Syl-Off 7028 as a curing agent and 0.5 pt of Syl-Off 4000 as a catalyst were added to 7651 of DOW Corning Corp. as an adhesive agent of Comparative Example 1, and the resulting mixture was stirred such that the solid content reached 20% and coated to a final thickness of 3 μm on 38 μm PET as a protective substrate.

A laminated structure was prepared in the same manner as in Example 1, except that a mixture of KR3700 and KR3704 as an adhesive agent of Comparative Example 2 were stirred at a mixing ratio of 10:90 and then coated to a final thickness of 25 μm on a fluorine-releasing film.

A laminated structure was prepared in the same manner as in Example 1, except that a mixture of KR3700 and KR3704 as an adhesive agent of Example 2 was stirred at a mixing ratio of 60:40 and then coated to a final thickness of 25 μm on a fluorine-releasing film.

1 pt of Syl-Off 7028 as a curing agent and 0.5 pt of Syl-Off 4000 as a catalyst were added to 7651 from DOW Corning Corp. as an adhesive agent of Comparative Example 11, and the resulting mixture was stirred such that the solid content reached 20%, and was coated to a final thickness of 25 μm on 38 μm PET as a protective substrate.

Since there is no foldable display on the market yet, the (PI-based) cover window of the virtual foldable display was selected, and a protective film for a foldable display was attached to the same, and a suitable thickness for the protective substrate and a suitable adhesive strength as an adhesive agent were determined.

4R folding evaluation: One fluorine release film of the adhesive laminated with the protective substrate was removed and the resulting structure was laminated with a PI substrate (50 μm of GF200 of SKC Kolon PI Inc.), which is a virtual cover window. Then, the resulting structure was folded such that the outer surface became a protective substrate at a curvature of 4R (the interval between the protective films is 8 mm), was left for one day and then unfolded again, and the appearance was observed.

Folding evaluation: designated as "maintained" when there was no change in the adhesion between the PI substrate and the adhesive layer, designated as "damage of protective substrate" when the protective substrate was not returned to the original state due to plastic deformation after the protective substrate was folded, and designated as "detachment of protective substrate" when a lifting phenomenon occurring between the adhesive layer and the PI substrate caused formation of bubbles or tunnels therein.

As can be seen in Table 1, Examples 1 to 9 of Table 1, which relate to protective films for foldable displays according to one embodiment of the present application, maintain the adhesive force between the adhesive layer and the PI substrate within a specific range, and also maintain the thickness of the protective substrate within a specific range, thereby avoiding a lifting phenomenon between the protective substrate and the cover window of the foldable display, even if the foldable display device is repeatedly folded and unfolded multiple times.

In addition, the protective film for a foldable display according to one embodiment of the present application maintains the thickness of the protective substrate within a specific range, thereby efficiently preventing scratches from external impact of the foldable display device and providing excellent durability of the protective substrate.

In Comparative Examples 1 to 11, when the protective film for foldable displays does not satisfy the range of the adhesive force between the adhesive layer and the PI substrate or does not satisfy the thickness range of the protective film, the protective substrate is damaged or detached, as can be seen from the result of folding evaluation. In addition, in the case of Comparative Example 1, in which the thickness of the adhesive layer was 3 μm as well, a phenomenon in which the protective substrate was detached occurred because sufficient adhesive force was not realized.

The invention claimed is:

1. A protective film for a foldable display comprising:
an adhesive layer;
a protective substrate provided on a surface of the adhesive layer;
a first hard coating layer provided on an opposite surface to the surface of the protective substrate in contact with the adhesive layer; and
a second hard coating layer between the adhesive layer and the protective substrate,
wherein the protective substrate is in direct contact with the first and second hard coating layers,
wherein the adhesive layer comprises at least one adhesive selected from the group consisting of acrylic adhesives, silicone adhesives, urethane adhesives and rubber adhesives,
wherein the protective substrate has a thickness of 10 μm or more and 150 μm or less, and the first hard coating layer and the second hard coating layer each have a thickness of 1 μm or more and 10 μm or less, and wherein an adhesive force between a polyimide (PI) substrate and the adhesive layer is 12 gf/inch to 190 gf/inch as measured at 23° C. and 50 RH % after bonding the PI substrate to a surface of the adhesive layer bound to a protective substrate on an opposite side of the adhesive layer.

2. The protective film for a foldable display of claim 1, wherein the adhesive layer has a thickness of 5 μm or more and 50 μm or less.

3. The protective film for a foldable display of claim 1, wherein the protective substrate is selected from the group consisting of TPU, glass, polyethylene terephthalate (PET), polyester, polycarbonate (PC), polyimide (PI), polyethylene naphthalate (PEN), polyether ether ketone (PEEK), polyarylate (PAR), polycyclic olefin (PCO), polynorbornene, polyethersulphone (PES) and a cycloolefin polymer (COP).

4. The protective film for a foldable display of claim 1, wherein the adhesive layer further comprises at least one selected from the group consisting of a crosslinkable compound, a dispersant, a silane coupling agent, a photocuring agent, a thermosetting agent, a metal salt and a tackifier.

5. The protective film for a foldable display of claim 1, further comprising a release film on the opposite surface to the surface of the adhesive layer in contact with the protective substrate, or an opposite surface to a surface of the first hard coating layer in contact with the protective substrate.

6. A foldable display device comprising:
a foldable display; and
the protective film for a foldable display according to claim 1, provided on one surface of the foldable display,
wherein the adhesive layer of the protective film for a foldable display is in contact with one surface of the foldable display.

7. The foldable display device of claim 6, wherein the foldable display has a structure in which a flexible substrate, an organic light-emitting layer, a polarizer and a cover window are stacked in this order,
wherein the adhesive layer of the protective film for the foldable display is provided on an opposite surface to a surface of the cover window that is in contact with the polarizer.

8. The foldable display device of claim 7, wherein the flexible substrate is selected from the group consisting of TPU, glass, polyethylene terephthalate (PET), polyester, polycarbonate (PC), polyimide (PI), polyethylene naphthalate (PEN), polyether ether ketone (PEEK), polyarylate (PAR), polycyclic olefin (PCO), polynorbornene, polyethersulphone (PES) and a cycloolefin polymer (COP).

9. The foldable display device of claim 6, wherein a surface opposite to a surface of the foldable display that is in contact with the adhesive layer comprises:
a first region having a folding portion; and
a second region having a non-folding portion,
wherein the first region is disposed in a longitudinal direction of the foldable display.

10. The foldable display device of claim 9, wherein edges of the second region contact each other when the foldable display is folded based on the first region.

* * * * *